(12) United States Patent
Grohe et al.

(10) Patent No.: US 8,003,530 B2
(45) Date of Patent: Aug. 23, 2011

(54) METHOD FOR METALLIZING SEMICONDUCTOR ELEMENTS AND USE THEREOF

(75) Inventors: Andreas Grohe, Freiburg (DE);
Jan-Frederik Nekarda, Freiburg (DE);
Oliver Schultz-Wittmann, Freiburg (DE)

(73) Assignee: Fraunhofer-Gesellschaft zur Forderung der Angewandten Forschung E.V., Munich (DE)

( * ) Notice: Subject to any disclaimer, the term of this patent is extended or adjusted under 35 U.S.C. 154(b) by 0 days.

(21) Appl. No.: 12/399,268

(22) Filed: Mar. 6, 2009

(65) Prior Publication Data
US 2009/0221112 A1    Sep. 3, 2009

Related U.S. Application Data

(63) Continuation of application No. PCT/EP2007/008279, filed on Sep. 24, 2007.

(30) Foreign Application Priority Data

Sep. 22, 2006   (DE) .......................... 10 2006 044 936

(51) Int. Cl.
*H01L 21/44* (2006.01)
(52) U.S. Cl. ............ 438/660; 438/57; 438/83; 438/669; 438/674; 438/680

(58) Field of Classification Search .................... 438/57, 438/83, 613, 660, 669, 674, 680; 156/233, 156/234, 239, 240
See application file for complete search history.

(56) References Cited

U.S. PATENT DOCUMENTS

| | | | |
|---|---|---|---|
| 4,393,576 A | 7/1983 | Dahlberg | |
| 5,980,679 A * | 11/1999 | Severin et al. | 156/233 |

FOREIGN PATENT DOCUMENTS

| | | |
|---|---|---|
| DE | 10020412 | 8/2001 |
| EP | 0117348 | 9/1984 |
| EP | 1634673 | 3/2006 |
| JP | 2003246971 | 9/2003 |
| WO | 9940760 | 8/1999 |

OTHER PUBLICATIONS

English translation of International Preliminary Report on Patentability from corresponding PCT Application Serial No. PCT/EP2007/008279.

* cited by examiner

*Primary Examiner* — Matthew Smith
*Assistant Examiner* — John M Parker
(74) *Attorney, Agent, or Firm* — Gauthier & Connors LLP

(57) ABSTRACT

The present invention relates to a method for metallizing semiconductor components in which aluminium is used. In particular in the case of products in which the process costs play a big part, such as e.g. solar cells based on silicon, a cost advantage can be achieved with the invention. In addition, the present invention relates to the use of the method, for example in the production of solar cells.

14 Claims, 1 Drawing Sheet

METHOD FOR METALLIZING SEMICONDUCTOR ELEMENTS AND USE THEREOF

PRIORITY INFORMATION

Figure 1:
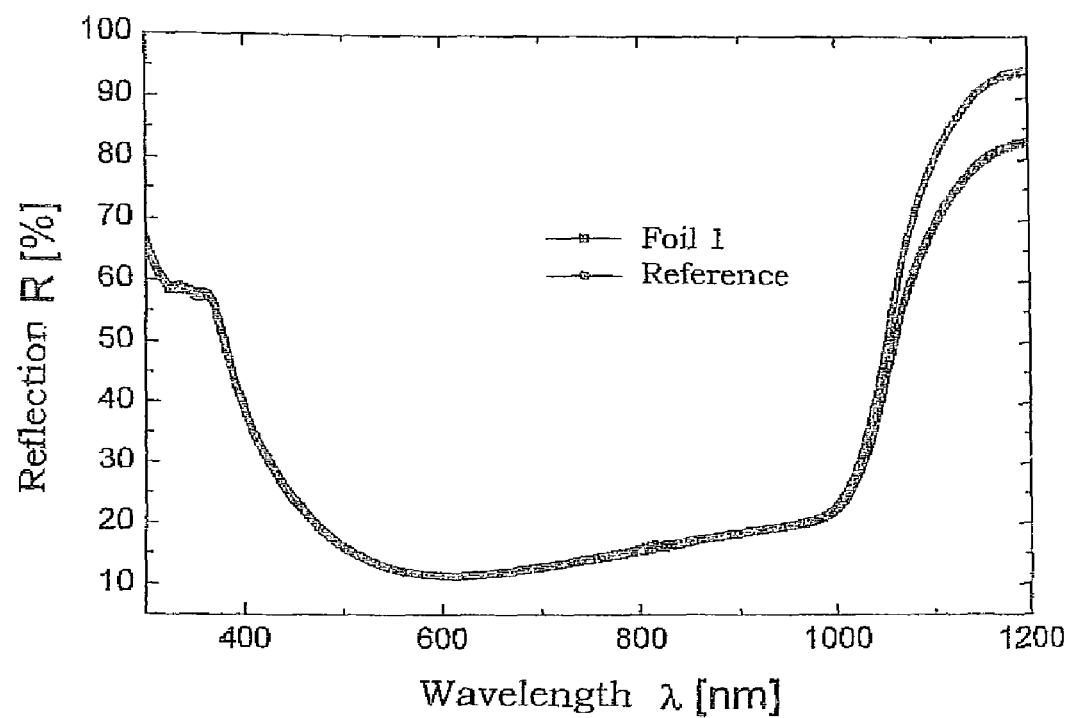

The present application is a continuation of International Application No. PCT/EP/2007/008279, filed on Sep. 24, 2007, that claims priority to German Application No. DE 102006044936.3, filed on Sep. 22, 2006, both of which are incorporated herein by reference in their entireties.

BACKGROUND OF THE INVENTION

The present invention relates to a method for metallizing semiconductor components in which aluminium is used. In particular in the case of products in which the process costs play a big part, such as e.g. solar cells based on silicon, a cost advantage can be achieved with the invention. In addition, the present invention relates to the use of the method, for example in the production of solar cells.

In the case of the crystalline solar cells produced for the most part nowadays, the rear-side contact is achieved by alloying an aluminium-containing screen printing paste into the silicon material. The paste is hereby heated briefly above the melting point thereof and subsequently forms a continuous aluminium layer which ensures the transverse conductivity of the rear-side metallization. Furthermore, the aluminium is mixed with the silicon and forms a eutectic which improves the electrical properties of the solar cell rear side.

This procedure in fact offers good electrical conductivity but the electrical and optical properties are only moderate. Furthermore, the thermal loading which is required when alloying in the paste represents a limitation with respect to the further optimisation possibilities of a solar cell since, for example, not all subsequent processes are temperature-stable.

A significant improvement in the optical and electrical properties can be achieved if the rear side is passivated firstly with a dielectric layer made of e.g. silicon oxide, silicon nitride or amorphous silicon. The rear side is subsequently metallized with an aluminium layer. This is applied as standard by vacuum methods, such as e.g. evaporation coating or sputtering.

In the case of these methods, problems arise above all as a result of the vacuum, there being understood in this respect pressures of <1 mbar. The production of the vacuum (i.e. evacuating the process chamber) extends the process times and leads to high costs. In addition, specific substances which would gas out in the vacuum cannot be coated in the vacuum. A third point is the impossibility of depositing layers deposited in the vacuum specifically at defined positions, i.e. an increased material consumption and also pollution of the process chamber arises, which in turn can lead to an impairment in quality of the coated components.

When using a dielectric layer, the aluminium layer can subsequently be contacted with the silicon via various methods, inter alia also via an LFC method.

It is the object of the present invention to make possible an economical and rapid method for coating a surface of a semiconductor with aluminium at low process temperatures. This object is achieved by the method having the features of patent claim 1. A use according to the invention of the method is indicated in patent claim 13. The respective dependent claims thereby represent advantageous developments.

SUMMARY OF THE INVENTION

According to the invention, a method is provided for at least partial metallization of at least one surface of semiconductor components with aluminium, wherein a) an aluminium foil is brought in direct contact at least partially with the surface, and
b) an at least partial connection of the aluminium to the surface of the semiconductor component is implemented subsequently by the effect of energy.

The application of the aluminium foil (step a) is effected with the help of suitable methods, it being essential that the foil is brought in direct contact partially with the substrate. This direct contact is important since otherwise only a perforation of the foil without attachment to the substrate is achieved. The direct contact can thereby be frictional and/or form-fitting.

In an advantageous embodiment, the application of the aluminium foil (step a) is thereby effected by pressing, blowing and/or suction onto the surface.

In an alternative favourable embodiment, the application of the aluminium foil (step a) is effected via a liquid film which is disposed between the surface and the aluminium foil. According to the invention, it is thereby irrelevant whether the application of the liquid film takes place in the state in which the foil is already applied on the surface of the substrate to be coated or whether wetting of the substrate and/or of the foil is effected in advance and the foil is applied on the substrate after wetting. A water film and/or a solvent film can thereby be used as liquid film.

A further preferable alternative embodiment of the method provides that the application of the aluminium foil (step a) is effected via a sacrificial layer which is disposed between the surface and the aluminium foil. The sacrificial layer is thereby selected preferably from the group comprising amorphous silicon, dielectric layers, metal layers, layers made of organic materials and/or foils made of these materials. The thereby used sacrificial layer dissolves entirely in method step b in the aluminium foil. In the example of amorphous silicon, complete dissolution in the aluminium is effected at temperatures of approx. 400° C. and above. The sacrificial layer, analogously to the liquid film, can already be located on the surface of the aluminium foil or of the component.

It is possible in principle due to the method according to the invention to apply aluminium foils of any layer thickness on a semiconductor surface but thicknesses of 1 μm to 20 μm are preferred.

Furthermore, it is advantageous if the aluminium foil is coordinated in the dimensions thereof to the dimensions of the surface of the semiconductor component to be metallized.

However, it is likewise possible as an alternative thereto that the aluminium foil has a greater dimension than the surface of the semiconductor component to be metallized.

It is likewise favourable if the aluminium foil has additional metallic structures. For example, instead of a homogeneous aluminium foil, a foil which contains in addition thin strips of metal for connecting the individual semiconductor components to each other can be used. These strips are attached at the same time to the foil and can protrude beyond the edge which forms the delimitation of the semiconductor element in order then to be able to be connected to other semiconductor components. As an alternative hereto, standard means, known to the person skilled in the art, for electrical connection of the individual components can also be placed under the aluminium foil before the process, which means can then be attached on the substrate, in method step b), at the same time both to the substrate and to the foil.

The connection of the aluminium foil provided according to feature b) is effected at least in the region in which the aluminium foil is in direct contact with the surface.

An efficient, both partial and full-surface, connection of the aluminium foil to the surface (method step b) can advantageously be effected by the effect of a laser. Hence a well-adhering connection is made possible in a simple manner. The laser radiation is thereby guided onto the foil from above and heats the latter temporarily so greatly that local melting is caused either with the substrate or with an intermmediately-situated sacrificial layer. The laser can likewise travel over prescribed structures, such as e.g. patterns on the foil: both strips and punctiform structures can hereby be produced. The laser is not thereby subjected to any particular restriction, but it is crucial that the laser emits radiation of a wavelength and with such an intensity that at least partial melting of the foil is ensured. In particular an infrared laser can thereby be used. However an energy effect according to the invention is not restricted exclusively to a laser process, but rather any other suitable embodiment which has the desired effect is likewise suitable. For example, irradiation of the aluminium foil could also be effected with sufficiently intensive, non-coherent infrared radiation.

The method is suitable in particular if a solar cell is used as semiconductor component. It is thereby preferred if the metallization is applied on the solar cell as a rear-side contact.

The present invention is explained in more detail with reference to the subsequent example without however wishing to restrict the invention to the special embodiments reproduced there.

For this purpose, the aluminium foil is brought in direct contact with the substrate with the help of suitable methods. This direct contact is important since otherwise only a perforation of the foil without attachment to the substrate is achieved. Suitable methods for direct contacting are for example mechanical pressing, blowing and/or suction. Furthermore, the foil can be attached to the substrate in that a few drops of a liquid are provided between the substrate and the foil and these are almost entirely eliminated. A third possibility would be to use an additional sacrificial layer which dissolves during an additional process step subsequent to application of the aluminium foil. Amorphous silicon which dissolves completely in aluminium during a temperature application above 400° C. is used for this purpose.

In the case of the previously implemented tests, the aluminium foil was attached to the samples with the help of vacuum suction. For this purpose, the foil was placed on the sample lapping over the edge and both sample and foil were suctioned securely with a vacuum device on the processing table. This process leads to the intermediately-situated air being removed entirely and the foil being placed on the sample over the entire surface.

As a final step, the aluminium foil is connected with the help of laser radiation to the substrate in such a manner that a well-adhering connection is produced. This laser radiation is guided from above onto the foil and heats the latter temporarily so greatly that local melting is caused either with the substrate or an intermediately-situated sacrificial layer. The laser can travel over various patterns on the foil: either the foil is processed over the entire surface or else only partially. Both strip-like and punctiform structures can hereby be produced.

There are several possibilities available for positioning the foil relative to the substrate. On the one hand, the foil can be placed on the substrate in an exact position at a size corresponding to the substrate. Hence the complete surface and also fragments of the surface can be metallized. Another possibility is to place the foil with a significantly larger surface area than the substrate beyond the substrate edge. Here also, both a complete attachment of the foil to the substrate and only partial attachment is possible. In a final laser step, the foil can then be cut down with modified laser parameters either to the substrate size or else to any shape. On the one hand, a well-adhering end of the foil can thereby be achieved with the substrate edge by the laser cut and, on the other hand, the foil protruding beyond the substrate edge can be cut off. These foil remainders can then be removed.

The facts according to the invention are clarified in more detail with reference to the following example and the illustrated FIG. 1 without the subject according to the invention being restricted to the special embodiment mentioned in the example.

EXAMPLE

A solar cell described above with a size of 20×20 mm$^2$ without a front-side texture on float-zone silicon is measured on a current-voltage test assembly for measuring the brightness characteristic line. The structure of the solar cell comprises 250 μm thick silicon wafers, which structure is provided on the front-side with an emitter layer (for the production of the p-n junction of the solar cell), an antireflection coating and a front-side metallization. Structures of this type are also termed high efficiency structures because these enable high efficiency with suitable material and process control. In the case of these structures, the possible leakage channels are suppressed as far as possible in order to eliminate any disruptive influences and consequently to be able to distinguish more clearly the variations used in the experiment. A dielectric coating is applied on the rear side, over which the commercially available aluminium foil (e.g. from the supermarket, thickness approx. 14 μm) is applied according to the invention. The aluminium foil is thereby fixed with the help of a suction device on the rear side and attached by laser irradiation at points. The parameters indicated in the following table and describing the quality of a solar cell were determined.

| $V_{OC}$ [mV] | $J_{SC}$ [mA/cm$^2$] | FF | η [%] |
| --- | --- | --- | --- |
| 661.7 | 33.68 | 0.784 | 17.5 |

DETAILED DESCRIPTION OF THE ILLUSTRATED EMBODIMENT

In FIG. 1, a reflection curve of this metallized solar cell according to the invention which is determined on a reflection test assembly is represented. The sample is thereby illuminated and the reflected proportion is measured as a function of the wavelength with the help of an Ulbricht globe. Compared to a reference solar cell (i.e. a solar cell which was not produced according to the method according to the invention), a virtually equally good reflection of the rear side in the wavelength range >1000 nm can be seen. These wavelength ranges are however scarcely suitable for the release of electrons since the absorption length here of the silicon is less than the solar cell thickness. For the wavelength ranges relevant for current production, (i.e. <1,000 nm), no difference in the degree of reflection can be detected between the reference solar cell and the solar cell coated according to the invention. Hence, with a significantly simplified method control, a rear-side coating with a quasi-equivalent degree of reflection is provided.

What is claimed is:
1. A method for at least partial metallization of at least one surface of semiconductor components with aluminum, wherein a) an aluminum foil is brought in direct contact with at least partially with the surface, wherein the application of the aluminum foil is effected by suction of the aluminum foil onto the surface, wherein the aluminum foil has a greater dimension than the surface of the semiconductor component to be metalized and the foil is placed on the component lapping over the edge and both sample and foil are suctioned securely with a vacuum device, and b) an at least partial connection of the aluminum to the surface of the semiconductor component is implemented subsequently by the effect of energy.

2. A method according to claim 1, wherein the aluminum foil has a thickness of 1 μm to 20 μm.

3. A method according to claim 1, wherein the aluminum foil is coordinated with the dimensions of the surface of the semiconductor component to be metallized.

4. A method according to claim 1, wherein the aluminum foil has a greater dimension than the surface of the semiconductor component to be metallized.

5. A method according to claim 1, wherein the aluminum foil has additional metallic structures.

6. A method according to claim 5, wherein the additional structures are configured in the form of metallic strips in the aluminum foil.

7. A method according to claim 5, wherein the metallic structures are configured such that they can be used for connection to further semiconductor components.

8. A method according to claim 1, wherein the at least partial connection of the aluminum foil to the surface (method step b) is effected by the effect of a laser.

9. A method according to claim 8, wherein the laser travels over prescribed structures.

10. A method according to claim 9, wherein strips and/or punctiform structures are produced by means of the laser.

11. A method according to claim 1, wherein a solar cell is used as a semiconductor component.

12. A method according to claim 11, wherein the metallization is configured on the solar cell as a rear-side contact.

13. A use of the method according to claim 1 for metallizing solar cells.

14. The use according to claim 13 as rear-side contact on the solar cell.

* * * * *